United States Patent
Reschovsky et al.

(10) Patent No.: US 9,160,164 B2
(45) Date of Patent: Oct. 13, 2015

(54) METHOD AND APPARATUS FOR FAULT DETECTION OF SERIES DIODES IN RECTIFIERS

(75) Inventors: John Mark Reschovsky, Schenectady, NY (US); Staci Jane Elaan, Schenectady, NY (US); Walter Reisinger, Weiz (AT)

(73) Assignee: Accumetrics, Inc., Depew, NY (US)

(*) Notice: Subject to any disclaimer, the term of this patent is extended or adjusted under 35 U.S.C. 154(b) by 1032 days.

(21) Appl. No.: 13/039,236

(22) Filed: Mar. 2, 2011

(65) Prior Publication Data

US 2011/0216449 A1    Sep. 8, 2011

Related U.S. Application Data

(60) Provisional application No. 61/309,630, filed on Mar. 2, 2010.

(51) Int. Cl.
*H02H 9/00*    (2006.01)
*H02M 1/32*    (2007.01)
*H02H 7/125*   (2006.01)

(52) U.S. Cl.
CPC ............... *H02H 9/00* (2013.01); *H02H 7/125* (2013.01); *H02M 1/32* (2013.01)

(58) Field of Classification Search
CPC ................................ H02M 1/32; H02H 7/125
USPC .......................................................... 361/18
See application file for complete search history.

(56) References Cited

U.S. PATENT DOCUMENTS

| | | | |
|---|---|---|---|
| 4,565,998 A | 1/1986 | Tsuji et al. | |
| 4,595,965 A | 6/1986 | Glennon | |
| 5,278,483 A * | 1/1994 | Trumpler et al. | 318/756 |
| 5,453,901 A | 9/1995 | Lackey | |
| 5,528,444 A | 6/1996 | Cooke et al. | |
| 6,693,778 B1 | 2/2004 | Pittman et al. | |
| 6,876,102 B2 | 4/2005 | Alappat | |
| 8,044,667 B2 * | 10/2011 | Cortigiani et al. | 324/522 |
| 2007/0279955 A1 * | 12/2007 | Liu et al. | 363/125 |
| 2008/0239595 A1 | 10/2008 | Lowther | |
| 2009/0167257 A1 | 7/2009 | Maddali et al. | |
| 2009/0296777 A1 | 12/2009 | Fish | |
| 2010/0066400 A1 | 3/2010 | Hendrickson et al. | |
| 2010/0134075 A1 | 6/2010 | Hlavac | |

FOREIGN PATENT DOCUMENTS

EP    0707367    4/1996

OTHER PUBLICATIONS

International Search Report & Written Opinion, Application No. PCT/US2011/026829, Applicant, Accumetrics Associates, Inc., Mailed Jun. 17, 2011, 12 pages.
Amended claims filed after receipt of European Search Report, Sep. 22, 2012, 4 pages.
Official Communication from the European Patent Office to grant European Patent for Application No. 11 709 829.3-1560, mailed Oct. 22, 2014, 51 pages.

* cited by examiner

*Primary Examiner* — Stephen W Jackson
*Assistant Examiner* — Ann Hoang
(74) *Attorney, Agent, or Firm* — Barclay Damon LLP

(57) ABSTRACT

A method and apparatus for fault detection of series diodes in rectifiers is disclosed, wherein the voltages across one or both of the individual diodes, and/or the voltage across the pair of diodes are measured to determine a ratio between two of those voltages. The ratio is then analyzed to determine if a fault (e.g., a short circuit or an open circuit) is present. In some embodiments, circuitry can be included to compensate for the normal variations in diode characteristics (e.g., reverse leakage current, reverse recovery charge) between the pair of series diodes to minimize the potential for erroneous fault detection.

16 Claims, 16 Drawing Sheets

METHOD AND APPARATUS FOR FAULT DETECTION OF SERIES DIODES IN RECTIFIERS

CROSS-REFERENCE TO RELATED APPLICATIONS

This application claims the benefit of and priority to U.S. Provisional Patent Application Ser. No. 61/309,630, filed Mar. 2, 2010, and entitled "Series Diode Fault Detection," which is incorporated by reference herein. This application is related to International Patent Application No. PCT/US11/26829, filed Mar. 2, 2011, and entitled "Method and Apparatus for Fault Detection of Series Diodes in Rectifiers," which is incorporated by reference herein.

BACKGROUND OF THE INVENTION

The subject matter disclosed herein relates to fault detection of series diodes, and more particularly, a method and apparatus for fault detection of series diodes in rectifiers.

Rectifiers are used in a variety of applications to convert alternating current (AC) to direct current (DC), including synchronous electric machines, such as AC motors and generators, which typically have rotating field windings that need to be excited with large direct current (DC) currents in order to operate. To avoid the need to pass these high currents through carbon brushes and slip rings, many of these machines have brushless exciters. These brushless exciters include a rotating set of windings on the machine's rotor that pass through magnetic flux from stationary poles, producing AC current on the rotor. The AC current is then rectified to DC current using a set of rotor-mounted solid state diode rectifiers. Typically, three-phase rotor windings require six rectifier sets to achieve full-wave rectification. For added reliability, each rectifier set is often comprised of two redundant diodes, connected in series, where each diode has the capability to block the full operating reverse voltage by itself when reverse biased.

When series diodes in rectifier sets are functioning properly and reverse biased in the reverse polarity portion of the AC cycle, the pair of diodes will block the flow of current through the diode (while allowing only relatively small amounts of reverse leakage current (mA)) and be subjected to the full reverse voltage across the pair of diodes. A common failure (or fault) of a diode is when the diode allows current that is higher than the normal reverse leakage current to flow when reverse biased. This type of fault can result from a reverse breakdown failure where the reverse voltage damages the diode in some cases to the point where the diode operates as a short circuit when reverse biased. The reverse breakdown failure frequently occurs during transient conditions where the peak reverse voltage exceeds the maximum allowable reverse voltage rating of the diode, which causes a fusion or other breakdown of the diode's PN junction. After a reverse breakdown failure, a diode can no longer effectively block current in the reverse polarity portion of the AC cycle, causing the rectifier current to reach relatively high values and low reverse voltages. Other types of faults (e.g., pinhole shorts) can result in the diode allowing current that is higher than the normal reverse leakage current to flow when reverse biased without necessarily forming a short circuit. As used herein, the term short circuit shall be understood to be a fault condition in a reverse biased diode where the current flowing through the diode is higher than the normal reverse leakage current expected in a properly functioning diode. If only one of the pair of series diodes experiences a short circuit, the other diode can be rated to withstand the full reverse voltage on its own (e.g., 300V to 1000V) and continue to perform the required rectifier function. One problem with the use of redundant diodes is that, if there is no indication that one of the pair of redundant series diodes has experienced a short circuit, the system will continue to operate with the vulnerability that the second diode may fail, increasing the risk of significant damage to the machine. It is, therefore, desirable to have a means of detecting a short circuit in a single diode so repairs can be made on a planned basis and a forced shutdown of the machine upon total failure of diode set can be avoided.

When series diodes in rectifier sets are functioning properly and forward biased in the forward polarity portion of the AC cycle, the pair of diodes will allow flow of current through the diode with a relatively consistent forward voltage (e.g., 0.7V at low current and up to 1.5V at rated current) across the diode. Although less common than a short circuit, another possible fault experienced by a diode is that the diode does not allow the flow of current in the forward direction, causing it to function as an open circuit when forward biased. Even if only one of the pair of series diodes experiences an open circuit, this would inhibit proper operation of that rectifier set, placing greater current demand on the remaining five rectifier sets. It is, therefore, desirable to have a means of detecting the open circuit failure of a single diode so repairs can be made as soon as possible.

Since the series diodes for brushless exciters are mounted on rotating components, the detection of diode faults requires a means of evaluating the condition of the rotating series diodes and then communicating that condition off the rotor. Rotor telemetry is a known technique for communicating electrical signals off rotors by transmitting signals modulated with either analog or digital data from rotor mounted electronic transmitter modules to nearby receivers using, e.g., radio frequency (RF) or optical transmission schemes. These rotor telemetry systems generally also include an inductive power feature that involves coils or antennas, one rotating and one stationary. These coils transmit electrical RF energy from a stationary source to the rotating component, and that energy is rectified to power the rotating transmitter. Typically, the same antenna coil structures that are used for induction power also convey the information signal off the rotor.

One approach to using rotor telemetry to detect diode failures for series diodes on brushless exciters is disclosed in U.S. Pat. No. 6,693,778 B1 to Pittman et al. The diode fault detection system measures the forward voltage across each of the pair of series diodes during the forward polarity of the AC cycle to detect a short circuit. The system compares the measured forward voltage of the diodes to a programmable alarm limit and triggers an alarm that indicates a failed diode or failed pair of diodes. The diode fault detection system is configured to detect short circuit faults only and not necessarily open circuit faults. In addition, measurement of the forward voltage to detect a short circuit can be unreliable since the diode can be damaged by peak reverse voltage in a manner where the forward biased characteristics of the diode are not significantly altered despite the fact that the diode can no longer block current when reverse biased. For example, the forward voltage of a diode with a pinhole short may be almost the same as the forward voltage of a properly functioning diode. Furthermore, since half of the diode fault detection systems are connected to the positive excitation terminal and the other half are connected to the negative excitation terminal, where the terminals have voltage potentials generally hundreds of volts apart, the forward voltage measurement requires two separate modules (one for the diodes on the positive excitation terminal and one for the diodes on the negative excitation terminal), which each need to be powered with an isolated power supply derived from a separate induction power coil.

Another approach to using rotor telemetry to detect diode failures for series diodes on brushless exciters is disclosed in U.S. Patent Application Publication No. 2010/0134075 A1 to Hlavac. The diode fault detection system connects a current source as a sensor across each of the pair of diodes to detect reverse voltage across the each of the diodes. If the sensor detects a reverse voltage across the diode, it is assumed that the diode is functioning, while if the sensor does not detect a reverse voltage across the diode, it is assumed that the diode is not functioning properly. The diode fault detection system is configured to detect short circuit faults only and not necessarily open circuit faults. In addition, making a decision on the presence of a reverse breakdown fault based upon the presence of reverse voltage in excess of a fixed threshold can be unreliable. Since the exciter may be operated over a large range of output voltages and diode characteristics within a rectifier set may be mismatched, a fixed threshold that is set too high may result in failure detection at low operating voltages when none exists and a fixed threshold that is set too low may fail to detect a real existing fault at higher operating voltages.

There is a need to provide improved detection of a diode fault (e.g., a short circuit or open circuit) in redundant series diodes in rectifier sets, including rectifier sets used for synchronous electric machines, such as AC motors and generators.

The discussion above is merely provided for general background information and is not intended to be used as an aid in determining the scope of the claimed subject matter.

BRIEF DESCRIPTION OF THE INVENTION

A method and apparatus for fault detection of series diodes in rectifiers is disclosed, wherein the voltages across one or both of the individual diodes, and/or the voltage across the pair of diodes are measured to determine a voltage ratio between two of those voltages. The voltage ratio is then analyzed to determine if a fault (e.g., a short circuit or an open circuit) is present. In some embodiments, circuitry can be included to compensate for the normal variations in diode characteristics (e.g., reverse leakage current, reverse recovery charge) between the pair of series diodes to minimize the potential for erroneous fault detection. An advantage that may be realized in the practice of some of the embodiments of the invention is the improved detection of a diode fault in a pair of series diodes in a rectifier, reducing the risk of significant damage to the machine in which the diodes are installed. Faster and more accurate fault detection can allow repairs of the rectifier to be made on a planned basis, avoiding a forced shutdown of the machine upon total failure of the pair of series diodes in the rectifier. Also, by employing a voltage ratio rather than a fixed threshold, the fault detection can be used at all possible operating voltages, corresponding to machine operating conditions ranging from no load to full load.

In one exemplary embodiment, a method for fault detection of a first diode and a second diode connected in series in a rectifier is disclosed. The method comprises the steps of measuring a first voltage across the first diode, measuring a second voltage across the first diode and the second diode, determining the voltage ratio between the first voltage and the second voltage, and determining whether the voltage ratio is within a range of values, wherein a fault is detected in the first diode or the second diode if the voltage ratio is outside of the range of values. In one embodiment, wherein the first voltage is the reverse voltage across the first diode during the reverse polarity cycle of the AC signal, and the second voltage is the reverse voltage across the first diode and the second diode during the reverse polarity cycle of the AC signal, a short circuit is detected across the first diode or the second diode if the ratio is outside the range of values. In another embodiment, wherein the first voltage is the forward voltage across the first diode during the forward polarity cycle of the AC signal, and the second voltage is the forward voltage across the first diode and the second diode during the forward polarity cycle of the AC signal, an open circuit is detected across the first diode or the second diode if the ratio is outside the range of values.

In another exemplary embodiment, a method for fault detection of a first diode and a second diode connected in series in a rectifier of an AC signal is disclosed. The method comprises the steps of measuring a first voltage across the first diode, measuring a second voltage across the second diode, determining the voltage ratio between the first voltage and the second voltage, and determining whether the voltage ratio is within a range of values, wherein a fault is detected in the first diode or the second diode if the voltage ratio is outside of the range of values. In one embodiment, wherein the first voltage is the reverse voltage across the first diode during the reverse polarity cycle of the AC signal, and the second voltage is the reverse voltage across the second diode during the reverse polarity cycle of the AC signal, a short circuit is detected across the first diode or the second diode if the ratio is outside the range of values. In another embodiment, wherein the first voltage is the forward voltage across the first diode during the forward polarity cycle of the AC signal, and the second voltage is the forward voltage across the second diode during the forward polarity cycle of the AC signal, an open circuit is detected across the first diode or the second diode if the ratio is outside the range of values.

In yet another exemplary embodiment, an apparatus for fault detection of a first diode and a second diode connected in series in a rectifier of an AC signal is disclosed. The apparatus comprises a first resistor connected in parallel across the first diode, wherein the parallel connection of the first resistor and the first diode results in a first voltage across the first diode during the reverse polarity cycle of the AC signal, a second resistor connected in parallel across the second diode, wherein the parallel connection of the second resistor and the second diode results in a second voltage across the second diode during the reverse polarity cycle of the AC signal, wherein the ratio of the first voltage to the sum of the first voltage and the second voltage is within a range of values, and the ratio of the second voltage to the sum of the first voltage and the second voltage is within the range of values. In one embodiment, the apparatus further comprises a capacitor connected in parallel across the first diode and the first resistor, wherein the second diode has a higher reverse recover charge than the first diode and wherein the capacitor receives the current flowing through the second diode during the reverse polarity cycle of the AC signal, depleting the residual reverse recovery charge in the second diode and reducing the reverse recovery time of the second diode. In another embodiment, the apparatus further comprises an active semiconductor switch connected in parallel across the first diode and the first resistor, wherein the second diode has a higher reverse recover charge than the first diode and wherein the active semiconductor switch receives the current flowing through the second diode during the reverse polarity cycle of the AC signal, depleting the residual reverse recovery charge in the second diode and reducing the reverse recovery time of the second diode.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

A method and apparatus for fault detection of series diodes in rectifiers is disclosed, wherein the voltages across one or both of the individual diodes, and/or the voltage across the pair of diodes are measured to determine a voltage ratio between two of those voltages. The voltage ratio is then analyzed to determine if a fault (e.g., a short circuit or an open circuit) is present. In some embodiments, circuitry can be included to compensate for the normal variations in diode characteristics (e.g., reverse leakage current, reverse recovery charge) between the pair of series diodes to minimize the potential for erroneous fault detection.

Figure 1:
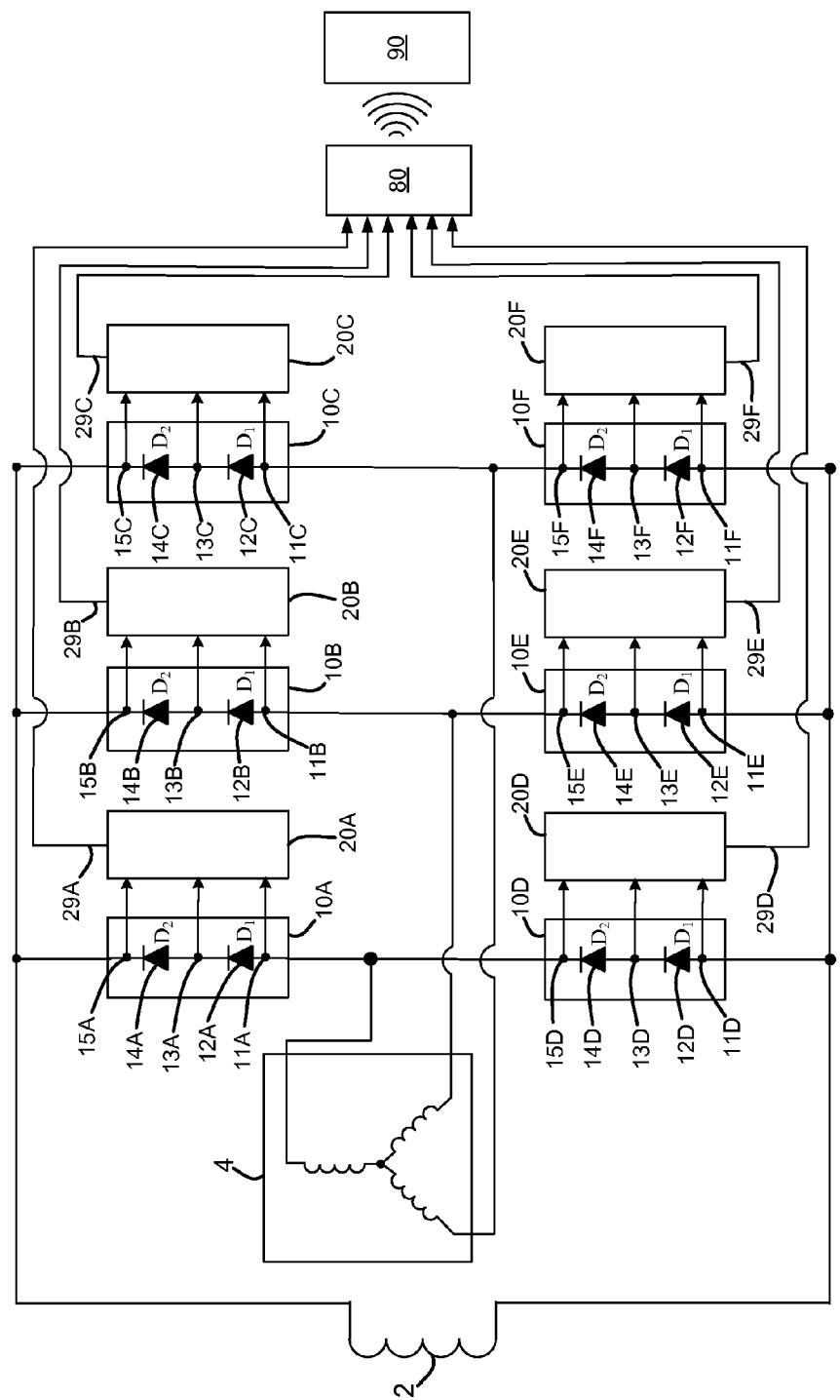
FIG. 1 is a schematic diagram of a synchronous electric machine with a plurality of diode fault detection modules for a plurality of series diode modules in an exemplary embodiment of the invention.

FIG. 1 is a schematic diagram of a synchronous electric machine with a plurality of diode fault detection modules 20A, 20B, 20C, 20D, 20E, 20F for a plurality of series diode modules 10A, 10B, 10C, 10D, 10E, 10F in an exemplary embodiment of the invention. The exemplary synchronous electric machine has a brushless exciter including the three-phase rotating armature windings 4 and six series diode modules 10A, 10B, 10C, 10D, 10E, 10F connected to produce a full-wave rectified DC current which is supplied to the main field winding 2. For simplicity, it will be understood that each of the plurality of series diode modules 10A, 10B, 10C, 10D, 10E, 10F can be constructed the same and that description of the components of one series diode module 10 applies to the others. Similarly, for simplicity, it will be understood that each of the plurality of diode fault detection modules 20A, 20B, 20C, 20D, 20E, 20F can be constructed the same and that description of the components of one diode fault detection module 20 applies to the others.

Turning to the exemplary series diode module 10, the module 10 includes two series connected diodes 12, 14, with the first diode ($D_1$) 12 on the anode side 11 of the series diode module 10, and a second diode ($D_2$) 14 on the cathode side 15 of the series diode module 10, with a mid-point 13 between the two diodes 12, 14. It will be understood that, although this description refers to the anode side diode as the first diode 12 and the cathode side diode as the second diode 14, those labels are interchangeable (i.e., the cathode side diode could be referred to as the first diode, while the anode side diode could be referred to as the second diode depending on the terminology chosen). The diode fault detection module 20 monitoring the series connected diodes 12, 14 for faults can be mounted in the brushless exciter. In one embodiment, the diode fault detection system 20 is mounted proximate the series diode module 10 allowing for short wire connections between the two modules 10, 20, and thereby minimizing the amount of high voltage wiring. In one embodiment, the diode fault detection module 20 requires no electrical power supply as it is energized exclusively from the voltage applied across the diodes 12, 14 of the series diode module 10. Snubber circuits (not shown) can be connected across the diodes 12, 14 in the series diode module 10 to limit voltage transients as the diodes 12, 14 are commutated.

Figure 2:
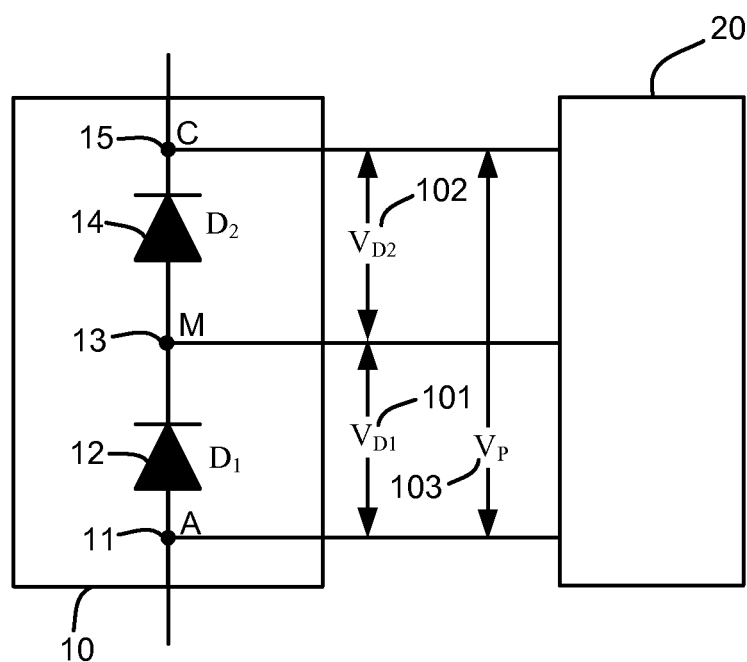
FIG. 2 is a schematic diagram of a series diode module connected to a diode fault detection module in an exemplary embodiment of the invention.

FIG. 2 is a schematic diagram of a series diode module 10 connected to a diode fault detection module 20 in an exemplary embodiment of the invention. The diode fault detection module 20 is connected to and monitors the diodes 12, 14 of the series diode module 10 at the anode side 11, mid-point 13, and cathode side 15 of the series diode module 10. As shown in FIG. 2, the diode fault detection module 20 can measure the voltage ($V_{D1}$) 101 across the first diode ($D_1$) 12 of the series diode module 10. The diode fault detection module 20 can also measure the voltage ($V_{D2}$) 102 across the second diode ($D_2$) 14 of the series diode module 10. The diode fault detection module 20 can also measure the voltage ($V_P$) 103 across the pair of diodes 12, 14.

Figure 3:
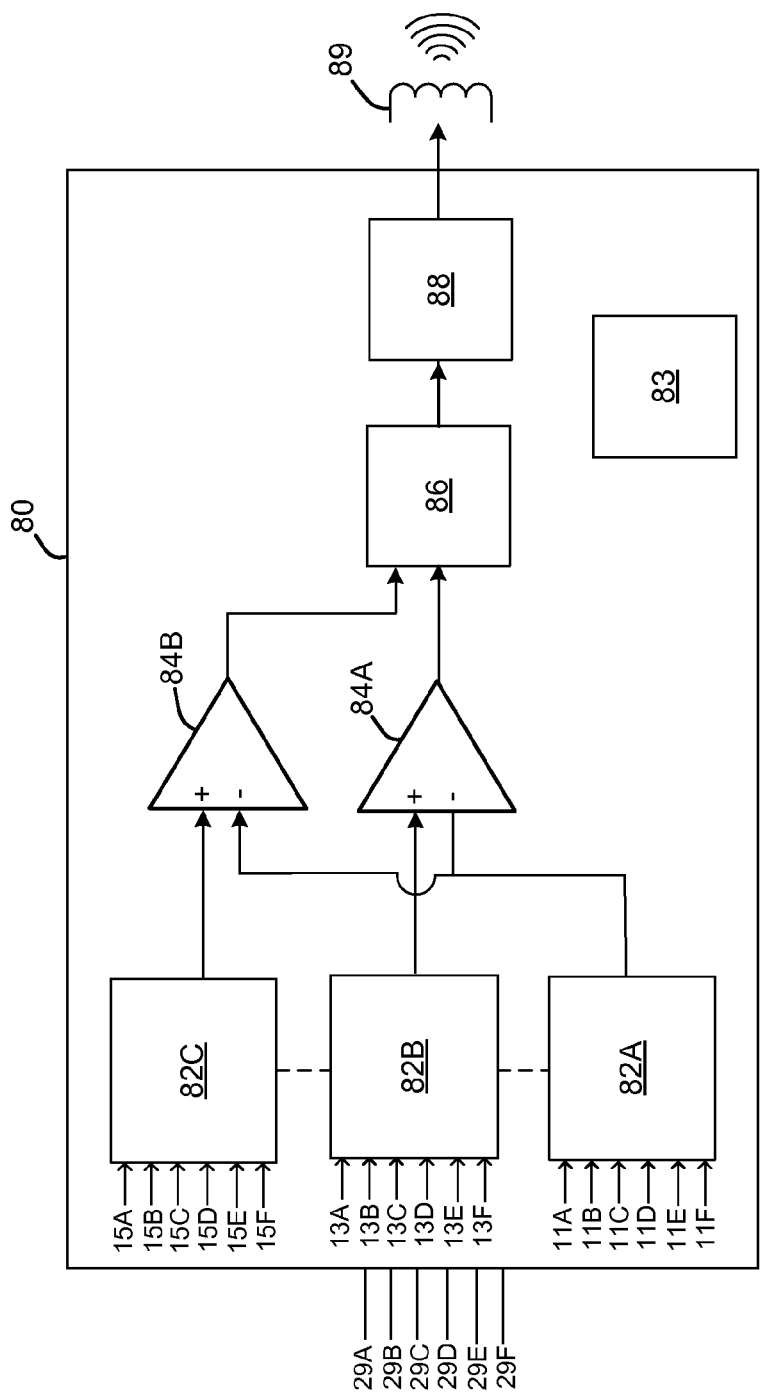
FIG. 3 is a block diagram of a telemetry transmitter module in an exemplary embodiment of the invention.

Returning to FIG. 1, in one exemplary embodiment, the multiple outputs 29 of each diode fault detection module 20 (including the outputs monitoring the anode side 11, mid-point 13, and cathode side 15 of the series diode module 10) can be connected to a telemetry transmitter module 80 through a cable harness. The telemetry transmitter module 80 transmits data to a telemetry receiver module 90. FIG. 3 is a block diagram of a telemetry transmitter module 80 in an exemplary embodiment of the invention. The telemetry transmitter module 80 can sample, digitize, and transmit data of the rotating elements, including the diode fault detection modules 20A, 20B, 20C, 20D, 20E, 20F using wireless techniques. In one embodiment of the invention, the telemetry transmitter module 80 is mounted on the exciter rotor and is powered inductively through closely coupled antenna coils, one rotating and the other non-rotating. These coils provide RF power that is generated in the telemetry receiver unit 90, coupled to the rotor where it is rectified and regulated by the DC power supply circuitry 83 in the telemetry transmitter module 80.

The outputs 29A, 29B, 29C, 29D, 29E, 29F from the diode fault detection module 20A, 20B, 20C, 20D, 20E, 20F, including the connections to the cathode side 15A, 15B, 15C, 15D, 15E, 15F, mid-point 13A, 13B, 13C, 13D, 13E, 13F, and anode side 11A, 11B, 11C, 11D, 11E, 11F of the series diode modules 10A, 10B, 10C, 10D, 10E, 10F, are inputs to telemetry transmitter module 80. For example, a first multiplexer 82C receives as inputs the outputs of the diode fault detection modules 20A, 20B, 20C, 20D, 20E, 20F monitoring the cathode side 15A, 15B, 15C, 15D, 15E, 15F of the series diode modules 10A, 10B, 10C, 10D, 10E, 10F, while a second multiplexer 82B receives as inputs the outputs of the diode fault detection modules 20A, 20B, 20C, 20D, 20E, 20F monitoring the mid-point 13A, 13B, 13C, 13D, 13E, 13F of the series diode modules 10A, 10B, 10C, 10D, 10E, 10F, while a third multiplexer 82A receives as inputs the outputs of the diode fault detection modules 20A, 20B, 20C, 20D, 20E, 20F monitoring the anode side 11A, 11B, 11C, 11D, 11E, 11F of the series diode modules 10A, 10B, 10C, 10D, 10E, 10F.

In one embodiment, the three multiplexers 82A, 82B, 82C are synchronized to sequence through the inputs to sequentially test for faults in each of the series diode modules 10A, 10B, 10C, 10D, 10E, 10F. The outputs of the multiplexers 82A, 82B, 82C can be provided to two differential instrumentation amplifiers 84A, 84B, which can provide the representations of two of the voltages ($V_{D1}$ 101, $V_{D2}$ 102, $V_P$ 103) measured by the diode fault detection modules 20A, 20B, 20C, 20D, 20E, 20F. In one embodiment, the voltages can be attenuated by the factor A. The two voltages can be simultaneously digitized by a digitizer 86. The resulting digitized data can be transmitted off the rotor by the RF transmitter circuitry 88 using transmitter antenna coil 89. In one embodiment, the resulting RF carrier is coupled to the telemetry receiver 90 through the same antenna coils that are used for induction power.

Figure 4:
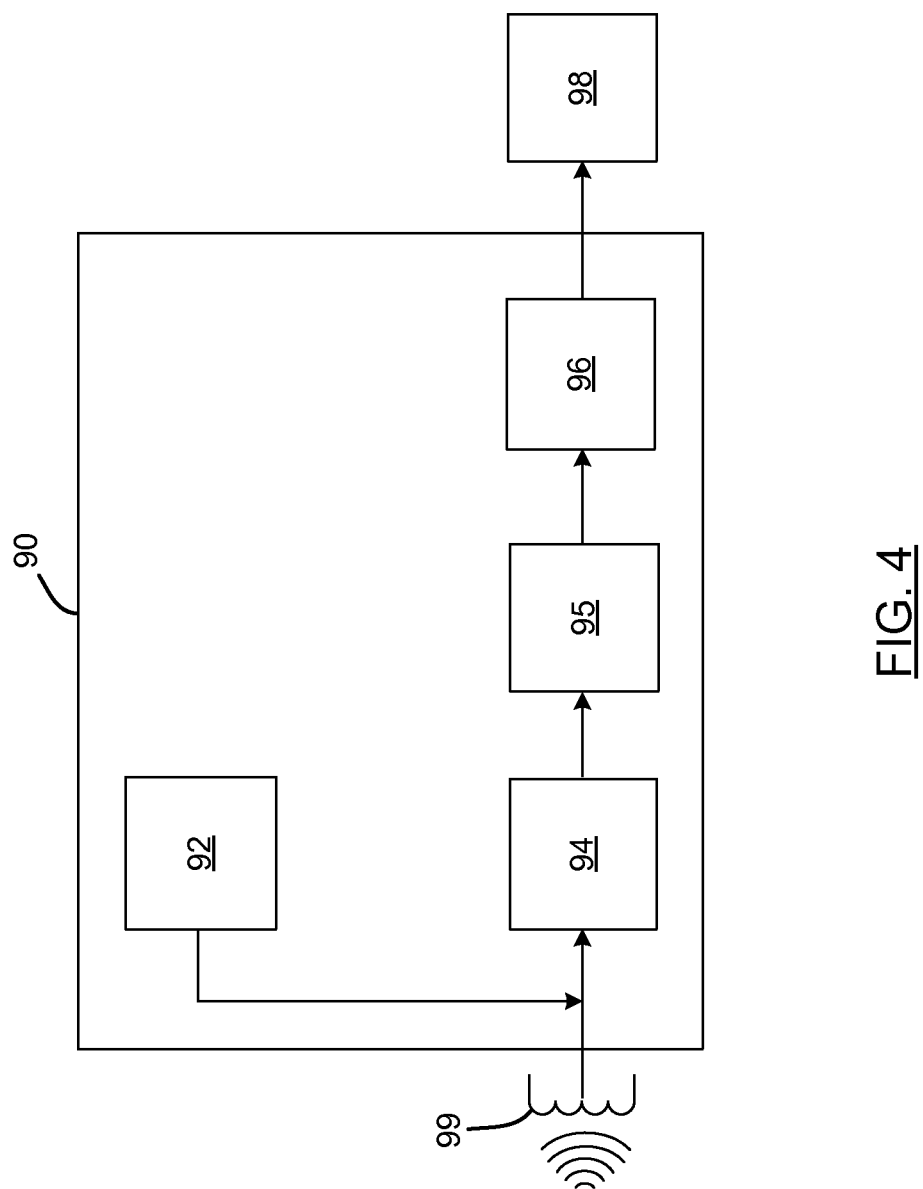
FIG. 4 is a block diagram of a telemetry receiver module in an exemplary embodiment of the invention.

FIG. 4 is a block diagram of a telemetry receiver module 90 in an exemplary embodiment of the invention. The telemetry receiver module 90 can receive the data from the telemetry transmitter module 80, process it, and based upon methods described below, detect and report the presence of diode faults. In one embodiment, the telemetry receiver module 90 is stationary and includes the RF generator circuit 92 used to induction power the telemetry transmitter module 80. In addition, the exemplary telemetry receiver module 90 includes an RF receiver 94 that recovers the digital data stream generated in the telemetry transmitter module 80 from the receiving antenna coil 99 and passes it to a digital processor 95, which synchronizes onto this stream and passes the resulting measurement data to a microprocessor 96. Software in this microprocessor 96 is programmed to detect the onset of reverse polarity and/or forward polarity in each AC cycle and may average the voltages for a number of cycles during which the multiplexers 82A, 82B, 82C of the telemetry transmitter module 80 are in a fixed position in order to minimize data scatter and noise. Voltage measurements at a sufficient sample rate and bandwidth are taken to reconstruct the entire waveform of these voltages, so as to distinguish how the voltages (and relative voltage ratios) change at different portions of the reverse polarity and forward polarity portion of the AC cycles. The software in this microprocessor 96 can compute the voltage ratios of the voltages to detect faults in the series diode modules 10A, 10B, 10C, 10D, 10E, 10F. This software may also be used to disable fault detection at times when the magnitude and/or period of the voltages indicates that the exciter is shut down or not in a normal operational mode.

The components of the telemetry transmitter module 80 and telemetry receiver module 90 may be combined with other rotor measurements that are useful for the application. Such measurements may include, but are not limited to, field winding insulation resistance, detection of insulation ground faults, measurements of field voltages and currents or other voltage or currents in the exciter circuitry, and measurements of temperatures of rotating components. Outputs from this telemetry receiver module 90 would typically include discrete alarms 98 indicating detection of faults as well as a means of communicating results of any quantitative measurements. Such communication may be in the form of a digital communication protocol or provided as analog signals.

In one embodiment, the voltages used to detect faults (both short circuits when the diodes 12, 14 are reverse biased and open circuits when the diodes 12, 14 are forward biased) in the series diode module 10 can be the voltage ($V_{D1}$) 101 across the first diode ($D_1$) 12 and the voltage ($V_P$) 103 across the pair of diodes 12, 14 (see FIG. 2). In another embodiment, the voltages used to detect faults in the series diode module 10 can be the voltage ($V_{D2}$) 102 across the second diode ($D_2$) 14 and the voltage ($V_P$) 103 across the pair of diodes 12, 14 (see FIG. 2). In yet another embodiment, the voltages used to detect faults in the series diode module 10 can be the voltage ($V_{D1}$) 101 across the first diode ($D_1$) 12 and the voltage ($V_{D2}$) 102 across the second diode ($D_2$) 14. Voltage ratios determined by the use of any two of these three voltage measurements can be used in the invention.

Figure 5:
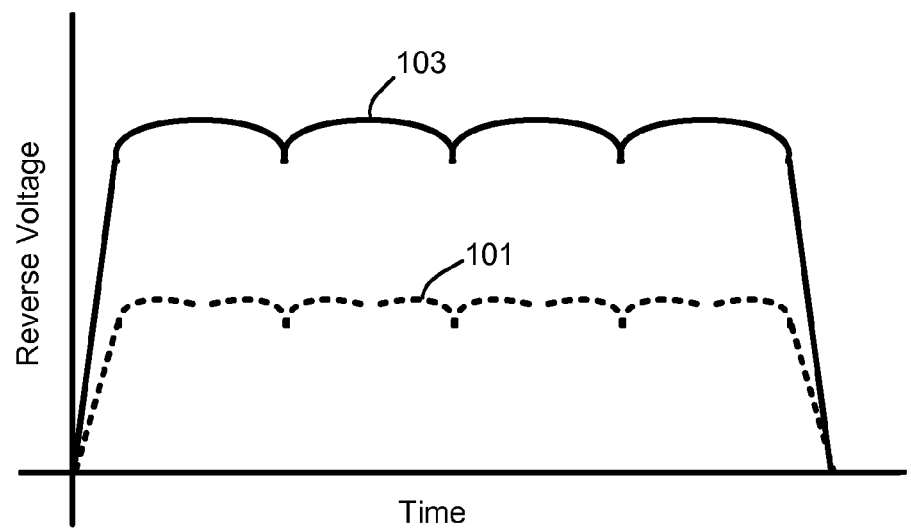
FIG. 5 is a graph of the reverse voltage across the diodes of an exemplary series diode module during the reverse polarity portion of the AC cycle with two properly functioning diodes with matched characteristics in an exemplary embodiment of the invention.

FIG. 5 is a graph of the reverse voltage across the diodes 12, 14 of an exemplary series diode module 10 during the reverse polarity portion of the AC cycle with two properly functioning diodes 12, 14 with matched characteristics in an exemplary embodiment of the invention. The reverse voltage ($V_{D1}$) 101 across the first diode ($D_1$) 12 is one half of the reverse voltage ($V_P$) 103 across the pair of diodes 12, 14, indicating that there are no short circuits. In this case, the voltage ratio $V_{D1}/V_P$ is in the range of values near the expected value of 0.5 throughout this period of the waveform, indicating that there are no short circuits. Accordingly, the normal algorithm for detection of a short circuit is that the voltage ratio $V_{D1}/V_P$ is outside of an acceptable range of values (e.g., 0.45 to 0.55 or 0.40 to 0.60) centered at the expected value (0.5). The limits of this range and other ratio ranges disclosed may be fixed, or may be established adaptively, based on previous test results, user controls or on a scale depending upon operating conditions. In another embodiment, where the inverse voltage ratio $V_P/V_{D1}$ is used, the voltage ratio $V_P/V_{D1}$ is in the range of values near the expected value of 2.0 (e.g., 1.8 to 2.2 or 1.6 to 2.4) throughout this period of the waveform, indicating that there are no short circuits.

Figure 6:
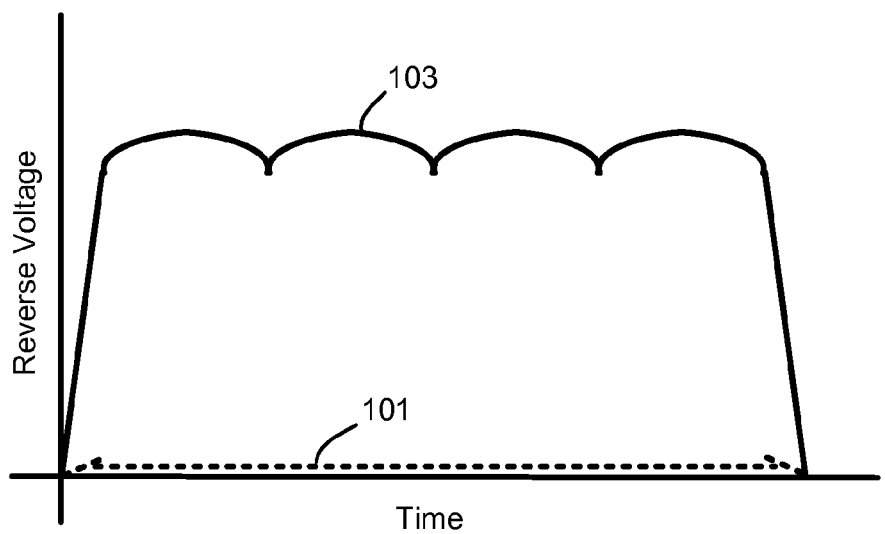
FIG. 6 is a graph of the reverse voltage across the diodes of an exemplary series diode module during the reverse polarity portion of the AC cycle with the first diode short circuited in an exemplary embodiment of the invention.

FIG. 6 is a graph of the reverse voltage across the diodes 12, 14 of an exemplary series diode module 10 during the reverse polarity portion of the AC cycle with the first diode ($D_1$) 12 short circuited in an exemplary embodiment of the invention. The reverse voltage ($V_{D1}$) 101 across the first diode ($D_1$) 12 remains near zero and the full reverse voltage is across the pair of diodes 12, 14 ($V_P$) 103, indicating that the first diode ($D_1$) 12 is short circuited and nearly the full reverse voltage is across the second diode ($D_2$) 14. In this case, the voltage ratio $V_{D1}/V_P$ is near zero (0) throughout this period of the waveform, indicating that the first diode ($D_1$) 12 has a short circuit across the junction. In another embodiment, where the inverse voltage ratio $V_P/V_{D1}$ is used, the voltage ratio $V_P/V_{D1}$ is large (e.g., approaching infinity) throughout this period of the waveform, indicating that the first diode ($D_1$) 12 has a short circuit across the junction.

Figure 7:
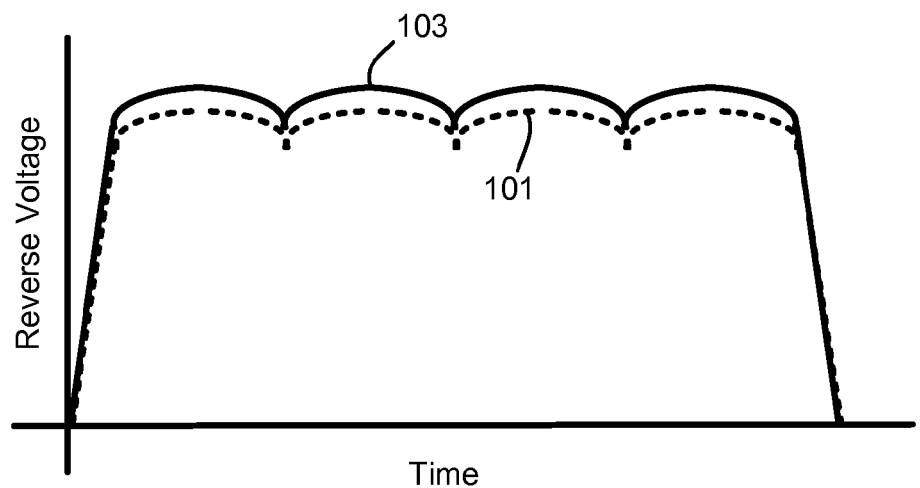
FIG. 7 is a graph of the reverse voltage across the diodes of an exemplary series diode module during the reverse polarity portion of the AC cycle with the second diode short circuited in an exemplary embodiment of the invention.

FIG. 7 is a graph of the reverse voltage across the diodes 12, 14 of an exemplary series diode module 10 during the reverse polarity portion of the AC cycle with the second diode ($D_2$) 14 short circuited in an exemplary embodiment of the invention. The reverse voltage ($V_{D1}$) 101 across the first diode ($D_1$) 12 is nearly equal to the reverse voltage across the pair of diodes 12, 14 ($V_P$) 103, indicating that the second diode ($D_2$) 14 is short circuited and nearly the full reverse voltage is across the first diode ($D_1$) 12. In this case, the voltage ratio $V_{D1}/V_P$ is near 1.0 (or unity) throughout this period of the waveform, indicating that the second diode ($D_2$) 14 has a short circuit across the junction. In another embodiment, where the inverse voltage ratio $V_P/V_{D1}$ is used, the voltage ratio $V_P/V_{D1}$ is near 1.0 (or unity) throughout this period of the waveform, indicating that the second diode ($D_2$) 14 has a short circuit across the junction.

In another embodiment, if the voltages used to detect short circuits when the diodes 12, 14 are reverse biased during the reverse polarity portion of the AC cycle and in the series diode module 10 are the voltage ($V_{D2}$) 102 across the second diode ($D_2$) 14 (instead of the first diode ($D_1$) 12 as in the prior embodiment) and the voltage ($V_P$) 103 across the pair of diodes 12, 14, the analysis would be similar. For example, when the voltage ratio $V_{D2}/V_P$ is in the range of values near the expected value of 0.5 or the inverse voltage ratio $V_P/V_{D2}$ is in the range of values near the expected value of 2.0 throughout this period of the waveform, this would indicate that there are no short circuits. When the voltage ratio $V_{D2}/V_P$ is near zero or the inverse voltage ratio $V_P/V_{D2}$ is large (e.g., approaching infinity) throughout this period of the waveform, this would indicate that the second diode ($D_2$) 14 has a short circuit across the junction. When the voltage ratios $V_{D2}/V_P$ or $V_P/V_{D2}$ are near 1.0 (or unity) throughout this period of the waveform, this would indicate that that the first diode ($D_1$) 12 has a short circuit across the junction.

In yet another embodiment, if the voltages used to detect short circuits when the diodes 12, 14 are reverse biased during the reverse polarity portion of the AC cycle in the series diode module 10 are the voltage ($V_{D1}$) 101 across the first diode ($D_1$) 12 and the voltage ($V_{D2}$) 102 across the second diode ($D_2$) 14, the analysis would be similar. For example, when the voltage ratios $V_{D2}/V_{D1}$ or $V_{D1}/V_{D2}$ are in the range of values near the expected value of 1.0 (e.g., 0.9 to 1.1 or 0.8 to 1.2) or throughout this period of the waveform, this would indicate that there are no short circuits. When the voltage ratio $V_{D2}/V_{D1}$ is near zero or the inverse voltage ratio $V_{D1}/V_{D2}$ is large (e.g., approaching infinity), throughout this period of the waveform, this would indicate that the second diode ($D_2$) 14 has a short circuit across the junction. When the voltage ratio $V_{D1}/V_{D2}$ is near zero or the inverse voltage ratio $V_{D2}/V_{D1}$ is large (e.g., approaching infinity), this would indicate that that the first diode ($D_1$) 12 has a short circuit across the junction.

Figure 8:
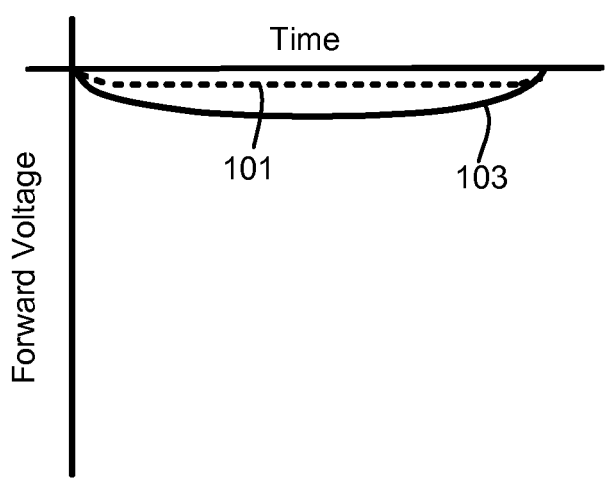
FIG. 8 is a graph of the forward voltage across the diodes of an exemplary series diode module during the forward polarity portion of the AC cycle with two properly functioning diodes with matched characteristics in an exemplary embodiment of the invention.

FIG. 8 is a graph of the forward voltage across the diodes 12, 14 of an exemplary series diode module 10 during the forward polarity portion of the AC cycle with two properly functioning diodes 12, 14 with matched characteristics in an exemplary embodiment of the invention. During this forward polarity portion of the cycle, the voltages are depicted in the negative direction, representing forward bias. The forward voltage ($V_{D1}$) 101 across the first diode ($D_1$) 12 is one half of the forward voltage ($V_P$) 103 across the pair of diodes 12, 14, indicating that there are no open circuits. In this case, the voltage ratio $V_{D1}/V_P$ is in the range of values near the expected value of 0.5 throughout this period of the waveform, indicating that there are no open circuits. The normal algorithm for detection of an open circuit is that the voltage ratio $V_{D1}/V_P$ is outside of an acceptable range of values (e.g., 0.45 to 0.55 or 0.40 to 0.60) centered at the expected value (0.5). The limits of this range may be fixed, or may be established adaptively, based on previous test results, user controls or on a scale depending upon operating conditions. In another embodiment, where the inverse voltage ratio $V_P/V_{D1}$ is used, the voltage ratio $V_P/V_{D1}$ is in the range of values near the expected value of 2.0 (e.g., 1.8 to 2.2 or 1.6 to 2.4) throughout this period of the waveform, indicating that that there are no open circuits.

Figure 9:
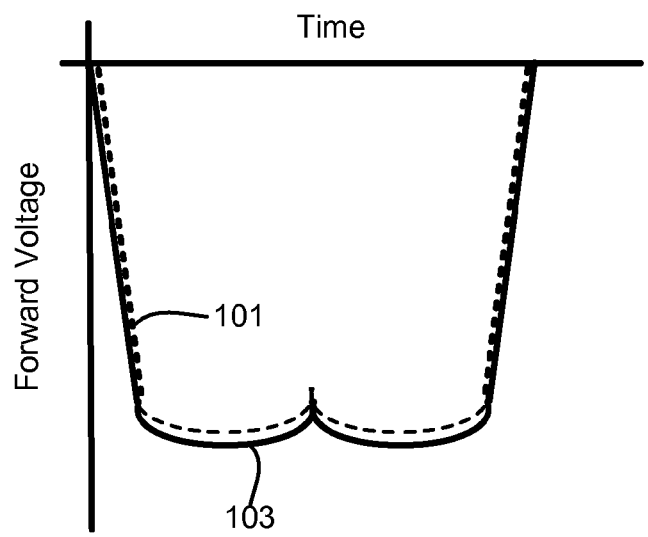
FIG. 9 is a graph of the forward voltage across the diodes of an exemplary series diode module during the forward polarity portion of the AC cycle with the first diode open circuited in an exemplary embodiment of the invention.

FIG. 9 is a graph of the forward voltage across the diodes 12, 14 of an exemplary series diode module 10 during the forward polarity portion of the AC cycle with the first diode ($D_1$) 12 open circuited in an exemplary embodiment of the invention. The forward voltage ($V_{D1}$) 101 across the first diode ($D_1$) 12 is nearly equal to the forward voltage across the pair of diodes 12, 14 ($V_P$) 103, indicating that the first diode ($D_1$) 12 is open circuited and nearly the full reverse voltage is across the first diode ($D_1$) 12. In this case, the voltage ratio $V_{D1}/V_P$ is near 1.0 (or unity) throughout this period of the waveform, indicating that the first diode ($D_1$) 12 has an open circuit across the junction. In another embodiment, where the inverse voltage ratio $V_P/V_{D1}$ is used, the voltage ratio $V_P/V_{D1}$ is near 1.0 (or unity) throughout this period of the waveform, indicating that the first diode ($D_1$) 12 has an open circuit across the junction.

Figure 10:
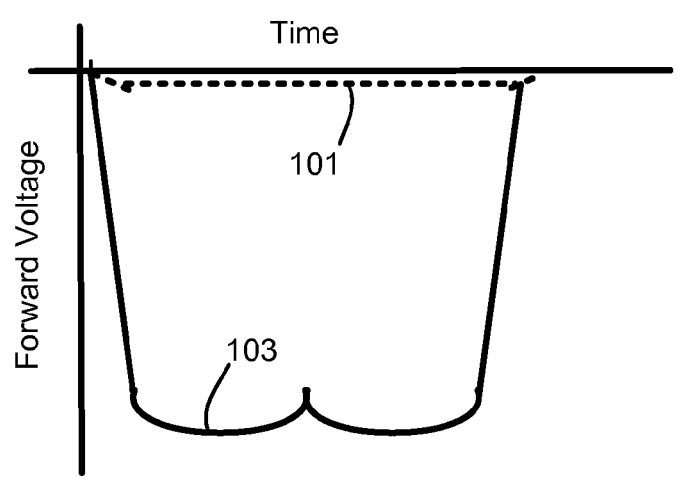
FIG. 10 is a graph of the forward voltage across the diodes of an exemplary series diode module during the forward polarity portion of the AC cycle with the second diode open circuited in an exemplary embodiment of the invention.

FIG. 10 is a graph of the forward voltage across the diodes 12, 14 of an exemplary series diode module 10 during the forward polarity portion of the AC cycle with the second diode ($D_2$) 14 open circuited in an exemplary embodiment of the invention. The forward voltage ($V_{D1}$) 101 across the first diode ($D_1$) 12 is approximately −1V while the forward voltage across the pair of diodes 12, 14 ($V_P$) 103 is a considerably larger negative voltage, indicating that the second diode ($D_2$) 14 is open circuited and nearly the full open circuit voltage is across the second diode ($D_2$) 14. In this case, the voltage ratio $V_{D1}/V_P$ is near zero (0) throughout this period of the waveform, indicating that the second diode ($D_2$) 14 has an open circuit across the junction. In another embodiment, where the inverse voltage ratio $V_P/V_{D1}$ is used, the voltage ratio $V_P/V_{D1}$ is large (e.g., approaching infinity) throughout this period of the waveform, indicating that the second diode ($D_2$) 14 has an open circuit across the junction.

In another embodiment, if the voltages used to detect open circuits when the diodes 12, 14 are forward biased during the forward polarity portion of the AC cycle in the series diode module 10 are the voltage ($V_{D2}$) 102 across the second diode ($D_2$) 14 (instead of the first diode ($D_1$) 12 as in the prior embodiment) and the voltage ($V_P$) 103 across the pair of diodes 12, 14, the analysis would be similar. For example, when the voltage ratio $V_{D2}/V_P$ is in the range of values near the expected value of 0.5 or the inverse voltage ratio $V_P/V_{D2}$ is in the range of values near the expected value of 2.0 throughout this period of the waveform, this would indicate that there are no open circuits. When the voltage ratios $V_{D2}/V_P$ or $V_P/V_{D2}$ are near 1.0 (or unity) throughout this period of the waveform, this would indicate that the second diode ($D_2$) 14 has an open circuit across the junction. When the voltage ratio $V_{D2}/V_P$ is near zero (0) or the inverse voltage ratio $V_P/V_{D2}$ is large (e.g., approaching infinity) throughout this period of the waveform, this would indicate that the first diode ($D_1$) 12 has an open circuit across the junction.

In another embodiment, if the voltages used to detect open circuits when the diodes 12, 14 are forward biased during the forward polarity portion of the AC cycle in the series diode module 10 are the voltage ($V_{D1}$) 101 across the first diode ($D_1$) 12 and the voltage ($V_{D2}$) 102 across the second diode ($D_2$) 14, the analysis would be similar. For example, when the voltage ratios $V_{D2}/V_{D1}$ or $V_{D1}/V_{D2}$ are in the range of values near the expected value of 1.0 (or unity) throughout this period of the waveform, this would indicate that there are no open circuits. When the voltage ratio $V_{D2}/V_{D1}$ is near zero or the inverse voltage ratio $V_{D1}/V_{D2}$ is large (e.g., approaching infinity), throughout this period of the waveform, this would indicate that the first diode ($D_1$) 12 has an open circuit across the junction. When the voltage ratio $V_{D1}/V_{D2}$ is near zero or the inverse voltage ratio $V_{D2}/V_{D1}$ is large (e.g., approaching infinity), this would indicate that that the second diode ($D_2$) 14 has an open circuit across the junction.

The assumption that the ratio of reverse voltages will be near an expected value when the diodes 12, 14 are functioning properly is correct when both diodes 12, 14 having matching characteristics (e.g., reverse leakage current, reverse recovery charge). If the first diode 12 has different characteristics than the second diode 14, even though both diodes 12, 14 are functioning properly, the ratio of voltages may not be as predicted. Since diodes typically do not have matching characteristics, but instead have varying characteristics, in some embodiments, circuitry can be included to compensate for the normal variations in diode characteristics between the pair of series diodes 12, 14 to minimize the potential for erroneous fault detection.

Turning first to reverse leakage current, ideally, when the diodes 12, 14 are reverse biased during the reverse polarity portion of the AC cycle, the diodes 12, 14, the diodes should block all current flow. In actual practice, diodes allow small amounts of reverse leakage current to flow when reverse biased, typically in the low milliampere range. The amount of reverse leakage current from diode to diode can vary significantly.

Figure 11:
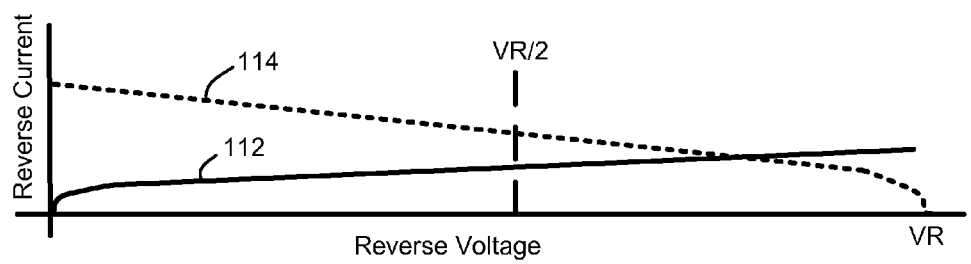
FIG. 11 is a graph of the reverse leakage current characteristics of the diodes of an exemplary series diode module with two properly functioning diodes with mismatched characteristics in an exemplary embodiment of the invention.

FIG. 11 is a graph of the reverse leakage current characteristics of the diodes 12, 14 of an exemplary series diode module 10 with two properly functioning diodes with mismatched characteristics in an exemplary embodiment of the invention. When the series diodes 12, 14 are operating at an instantaneous reverse voltage of $V_R$, the sharing of this reverse voltage may be graphically depicted as shown in FIG. 11, where the current-voltage characteristics 112 of the first diode ($D_1$) 12 is plotted from the origin and the current-voltage characteristics 114 for the second diode ($D_2$) 14 is plotted going negatively from the point $V_R$ on the voltage axis. Since both diodes 12, 14 must operate at the same current, the voltage at the intersection of these two curves indicates the potential at the midpoint 13 between the diodes (see FIG. 2). When both diodes 12, 14 have identical voltage-current characteristics, this intersection will be at exactly at $V_R/2$. But if the diodes 12, 14 are not matched, as shown in the FIG. 11, this voltage can vary substantially. This will cause the ratio of reverse voltages for diodes to vary from the expected value even though the diodes are not faulty.

For example, assume that the instantaneous reverse voltage ($V_R$) is 1000V and the reverse leakage current of the first diode ($D_1$) 12 reaches a reverse leakage current of 2 mA at a voltage of 800V, whereas the reverse leakage current of the second diode ($D_2$) 14, which is more leaky, reaches the same reverse leakage current of 2 mA at a voltage of only 200V. In this example, the voltage ratio $V_{D1}/V_P$ would be 0.8, while the voltage ratio $V_{D2}/V_P$ would be 0.2, far from the expected value of 0.5 even though the diodes 12, 14 are functioning properly without any faults. Mitigation of these voltage differences caused by differences in reverse leakage current characteristics without dissipating excessive power can be accomplished by connecting resistors of equal value in parallel across each of the diodes 12, 14.

Figure 12:
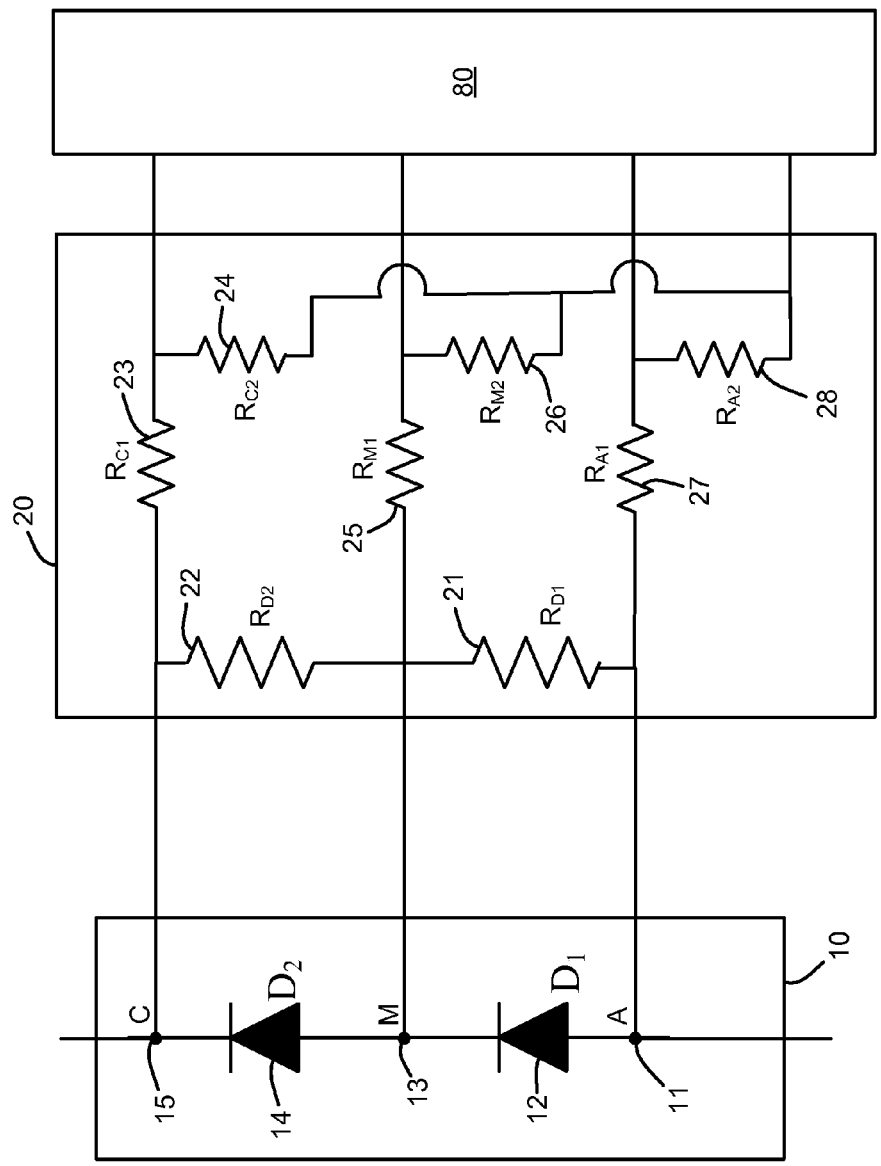
FIG. 12 is a schematic diagram of an exemplary series diode module and exemplary diode fault detection module with matching resistors and voltage divider resistors in an exemplary embodiment of the invention.

FIG. 12 is a schematic diagram of an exemplary series diode module 10 and exemplary diode fault detection module 20 with matching resistors $R_{D1}$ 21 and $R_{D2}$ 22 in an exemplary embodiment of the invention. In one embodiment, the resistors $R_{D1}$ 21 and $R_{D2}$ 22 are of equal value (R), one installed in parallel across each of the diodes 12, 14.

Figure 13:
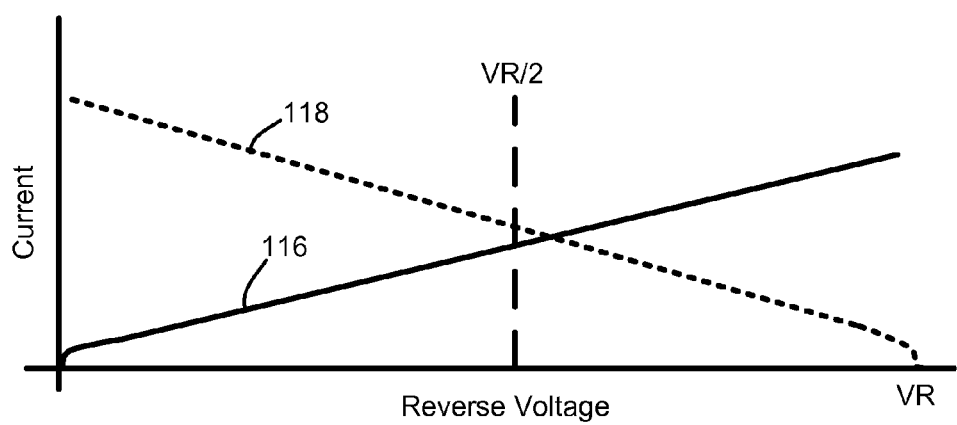
FIG. 13 is a graph of the equivalent reverse leakage current characteristics of the diodes and parallel resistors of an exemplary series diode module in the schematic diagram of FIG. 12 in an exemplary embodiment of the invention.

FIG. 13 is a graph of the equivalent reverse leakage current characteristic of the first diode ($D_1$) 12 in parallel with resistor $R_{D1}$ 21 and the equivalent reverse leakage current characteristic of the second diode ($D_2$) 14 in parallel with resistor $R_{D2}$ 22 of an exemplary series diode module 20 in the schematic diagram of FIG. 12 in an exemplary embodiment of the invention. The graph of FIG. 11 without the matching resistors $R_{D1}$ 21 and $R_{D2}$ 22 is altered by using a voltage-current characteristic of the combined diode with parallel resistor as in the schematic of FIG. 12, where the current-voltage characteristics 116 of the first diode ($D_1$) 12 is plotted from the origin and the current-voltage characteristics 118 for the second diode ($D_2$) 14 is plotted going negatively from the point $V_R$ on the voltage axis. The slope of the two voltage-current curves is pitched up with a slope that is increased by 1/R where R is the resistance of resistors $R_{D1}$ 21 and $R_{D2}$ 22. The lower this resistance, the steeper the slopes of the two curves 116, 118 and the closer the intersection will be to the ideal value of $V_R/2$. Continuing with the example from above, if the value of the matching resistors $R_{D1}$ 21 and $R_{D2}$ 22 was chosen to be 50KΩ, the equivalent reverse leakage of the first diode ($D_1$) 12 in parallel with resistor $R_{D1}$ 21 might reach a current of 11.5 mA at a voltage of 540 volts and the equivalent reverse leakage of the second diode ($D_2$) 14 in parallel with resistor $R_{D2}$ 22 might reach the same current of 11.5 mA at a voltage of 460 volts. In that case, the voltage ratio $V_{D1}/V_P$ would be 0.56, and the voltage ratio $V_{D2}/V_P$ would be 0.46, which are much closer to the expected value of 0.5 for properly functioning diodes without faults.

A designer can select values for this resistance (R) based upon worst case variations in diode characteristics and consideration of the size and power dissipation for the resistors. These matching resistors serve to desensitize the voltage ratio computation to normal variations in the reverse leakage current characteristics between the two diodes 12, 14. In one embodiment, the resistance of resistors $R_{D1}$ 21 and $R_{D2}$ 22 is chosen such that the ratio $V_{D1}/V_P$ of the voltage across the first diode ($D_1$) 12 to the sum of the voltages across the first diode ($D_1$) 12 and the second diode ($D_2$) 14 is within an acceptable range of values (e.g., 0.45 to 0.55 or 0.40 to 0.60) centered at the expected value (0.5), and the ratio $V_{D2}/V_P$ of the voltage across the second diode ($D_2$) 14 to the sum of the voltages across the first diode ($D_1$) 12 and the second diode ($D_2$) 14 is within an acceptable range of values (e.g., 0.45 to 0.55 or 0.40 to 0.60) centered at the expected value (0.5).

Returning to FIG. 12, the schematic diagram also includes voltage divider resistors $R_{C1}$ 23, $R_{C2}$ 24, $R_{M1}$ 25, $R_{M2}$ 26, $R_{A1}$ 27, $R_{A2}$ 28 in an exemplary embodiment of the invention. The voltage dividing resistors $R_{C1}$ 23, $R_{C2}$ 24, $R_{M1}$ 25, $R_{M2}$ 26, $R_{A1}$ 27, $R_{A2}$ 28 attenuate the voltages at the anode 11, mid-point 13, and cathode 15 of the series diode module 10. These voltages typically swing several hundreds of volts, which are too high to be handled directly by the low voltage data acquisition circuitry in the telemetry transmitter module 80. In one embodiment, all voltage dividers attenuate voltage by the same precise factor and are referenced to the same common node which serves as a ground reference in the telemetry system and is, e.g., connected to the exciter's negative DC bus. The voltage dividers allow all voltage measurements from each series diode module 10 to use the common ground associated with telemetry transmitter module 80 to avoid the need for isolated power supplies to supply each diode fault detection module 20.

In one embodiment, the total resistance in each voltage divider is approximately 1MΩ with an attenuation factor of 200:1, which would reduce a 500V exciter voltage range to 2.5V that can be handled by the telemetry transmitter module 80. The outputs of the three attenuators, one for the anode 11, one for the mid-point 13, and one for the cathode 15, along with the common node are passed from each diode fault detection module 20 to the telemetry transmitter module 80 where the two differential voltages used in the voltage ratio may be determined using two differential instrumentation amplifiers 84A, 84B (see FIG. 3).

The assumption that the ratio of reverse voltages will be near an expected value when the diodes 12, 14 are functioning properly is correct when both diodes 12, 14 having matching reverse recovery charge characteristics as well. The transition from forward polarity to reverse polarity in a diode does not occur instantaneously. During forward polarity, while the diode is forward biased and conducting, high densities of minority charge carriers exist in the region of the PN junction of the diode (i.e., electrons in the P side of the junction and holes in the N side of the junction). When the polarity is rapidly reversed and the diode is reverse biased, these minority carriers must be swept out of the region of the semiconductor junction before reverse currents will be blocked. The amount of charge represented by these minority carriers is referred to as reverse recovery charge and the time to deplete them is the reverse recovery time. Reverse recovery charge allows diodes to conduct during the reverse recovery time after they are reverse biased during the reverse polarity portion of the AC cycle until minority carriers in the junction are depleted and reverse current blocking is achieved. The amount of reverse recovery charge and resultant reverse recovery time from diode to diode can vary significantly.

When two diodes are connected in series for redundancy, if the two diodes are identical in the amount of reverse recovery charge in the junction and the amount of reverse recovery time, then a current would rapidly flow in the reverse direction through both series diodes depleting the reverse recovery charge in both diodes rapidly and simultaneously, with both diodes achieving reverse current blocking at the same time after the reverse recovery time. In this circumstance, the ratio of reverse voltages will be in the range of values near the expected value once the diodes 12, 14 achieve reverse current blocking in the reverse polarity portion of the AC cycle after the reverse recovery time, indicating that the diodes are functioning properly. In practical applications, the reverse recovery charge characteristics of the two diodes are not matched and the two diodes have different reverse recovery charges and times.

Figure 14:
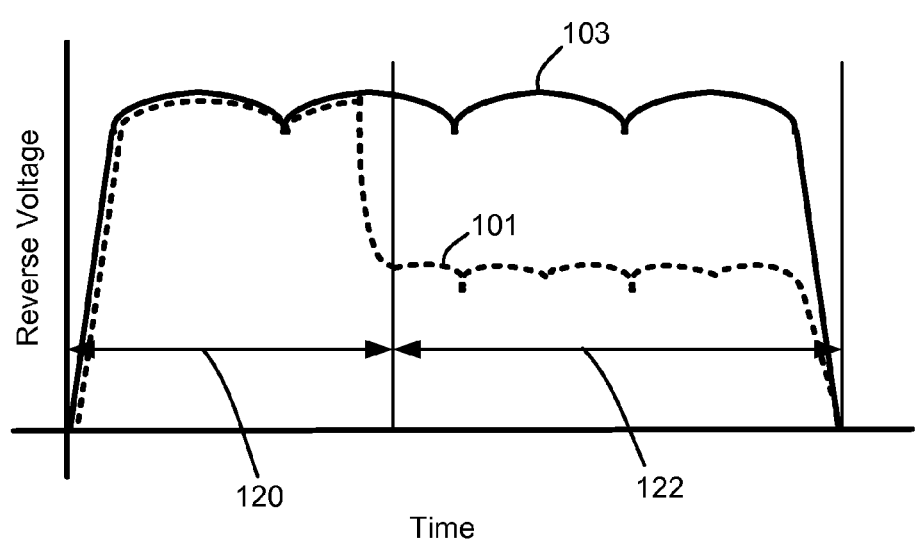
FIG. 14 is a graph of the reverse voltage across the diodes of an exemplary series diode module during the reverse polarity portion of the AC cycle where the second diode has a larger recovery charge than the first diode in an exemplary embodiment of the invention.

FIG. 14 is a graph of the reverse voltage across the diodes 12, 14 of an exemplary series diode module 10 during the reverse polarity portion of the AC cycle where the second diode ($D_2$) 14 has a larger recovery charge than the first diode ($D_1$) 12 in an exemplary embodiment of the invention. As soon as reverse voltage is applied, reverse current rapidly flowing through both diodes 12, 14 depletes most of the reverse recovery charge. But once all reverse recovery charge is depleted from the first diode ($D_1$) 12, it begins to block further current flow and the remaining reverse recovery charge in the second diode ($D_2$) 14 has no current path from which it can be depleted. As seen in FIG. 14, the reverse polarity portion of the AC cycle begins with a series diode reverse recovery time 120, in which the first diode ($D_1$) 12 has already depleted its reverse recovery charge and the second diode ($D_2$) 14 is left to gradually deplete its residual reverse recovery charge by the gradual recombination of holes and electrons within the semiconductor. During the series diode reverse recovery time 120, the reverse voltage ($V_{D1}$) 101 across the first diode ($D_1$) 12 is approximately equal to the reverse voltage ($V_P$) 103 across the pair of diodes 12, 14, since the depleted first diode ($D_1$) 12 has achieved reverse current blocking and the slowly depleting second diode ($D_2$) 14 appears as a short circuit with approximately zero (0) voltage across the second diode ($D_2$) 14. If this series diode reverse recovery time 120 is short compared to the reverse polarity portion of the AC cycle, then the voltage ratio methodology can be applied by applying the voltage ratio computation to the latter valid time interval 122 of the reverse polarity portion of the AC cycle when both diodes 12, 14 have depleted their reverse recovery charge. But if the series diode reverse recovery time 120 consumes a significant portion of the reverse polarity portion of the AC cycle and the voltage ratio is determined during this time, the voltage ratio may erroneously indicate that the diode with the higher reverse recovery charge (second diode ($D_2$) 14) is short circuited and needs to be replaced.

One method of avoiding determining the voltage ratio during the series diode reverse recovery time 120 is to employ a fixed delay time equal to the maximum or expected series diode reverse recovery time 120 after which the voltage ratio can be determined during the valid time interval 122. Since some rectifier designs use diodes whose reverse recovery characteristics and expected series diode reverse recovery time 120 are uncertain, an accurate fixed delay cannot be established. Accordingly, additional circuit components can be provided to expedite the series diode reverse recovery time 120 by removing the residual reverse recovery charge early in the reverse polarity portion of the AC cycle.

Figure 15:
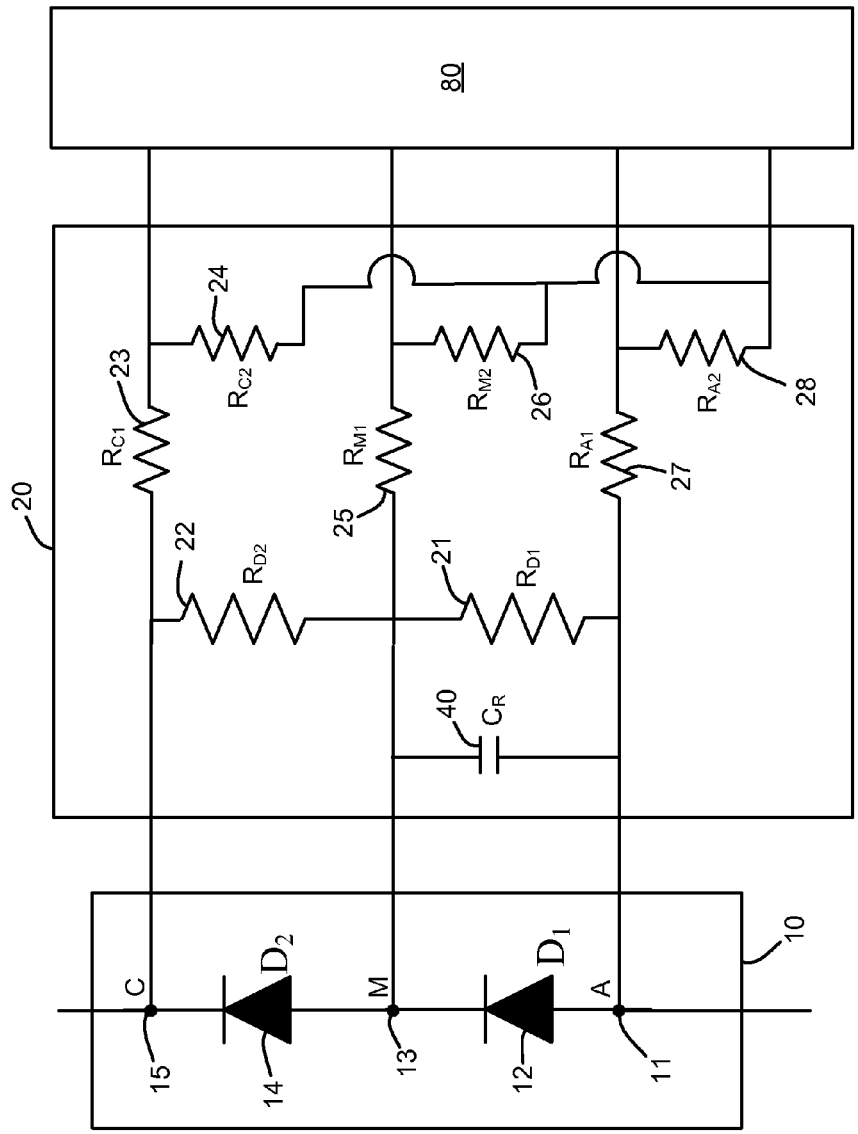
FIG. 15 is a schematic diagram of an exemplary series diode module and exemplary diode fault detection module with a capacitor for expediting the series diode reverse recovery time in an exemplary embodiment of the invention.

FIG. 15 is a schematic diagram of an exemplary series diode module 10 and exemplary diode fault detection module 20 with a capacitor ($C_R$) 40 for expediting the series diode reverse recovery time 120 in an exemplary embodiment of the invention. In this exemplary embodiment, it is assumed that the reverse recovery charge of the second diode ($D_2$) 14 is higher than the reverse recovery charge of the first diode ($D_1$) 12 as in FIG. 14. The capacitor ($C_R$) 40 is connected across the first diode ($D_1$) 12 and is positioned to allows the residual reverse recovery charge in the second diode ($D_2$) 14 to be rapidly depleted by current flowing through the second diode ($D_2$) 14 to charge the capacitor ($C_R$) 40 when the first diode ($D_1$) 12 has completed reverse recovery. The capacitor ($C_R$) 40 can be sized so that the product C*V is equal to the maximum residual charge in the second diode ($D_2$) 14 where C is the capacitance of the capacitor ($C_R$) 40 and V is the reverse voltage achieved during the series diode reverse recovery time. For example, a capacitor ($C_R$) 40 having a capacitance of 1 µF for an exciter having a reverse voltage of 500V can rapidly deplete a residual reverse recovery charge of 0.5 mC.

Figure 16:
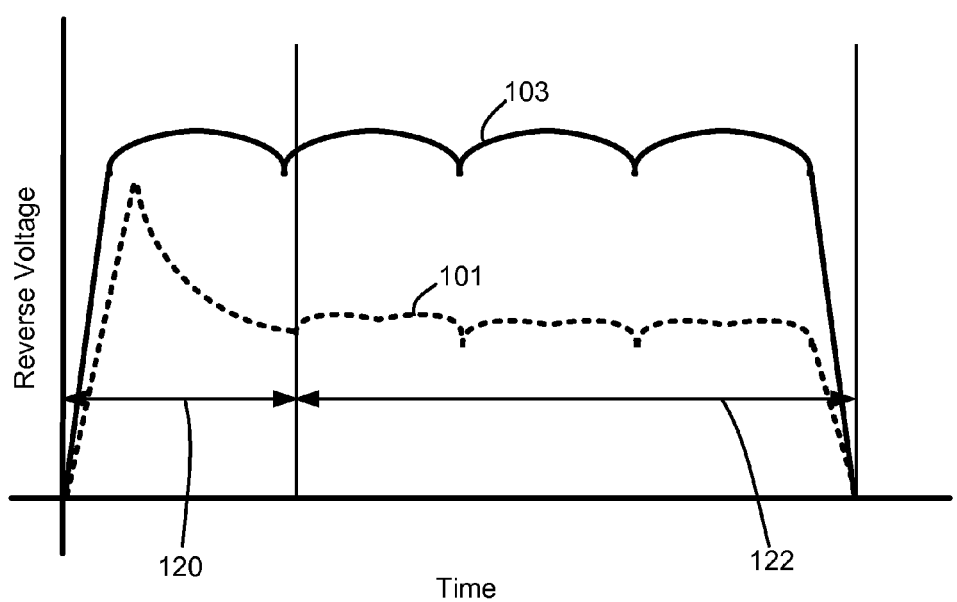
FIG. 16 is a graph of the reverse voltage across the diodes of an exemplary series diode module during the reverse polarity portion of the AC cycle in the schematic diagram of FIG. 15 in an exemplary embodiment of the invention.

FIG. 16 is a graph of the reverse voltage across the diodes 12, 14 of an exemplary series diode module 10 during the reverse polarity portion of the AC cycle in the schematic diagram of FIG. 15 in an exemplary embodiment of the invention. As compared with FIG. 14 for a circuit not having the capacitor ($C_R$) 40, the series diode reverse recovery time 120 is greatly reduced by the addition of the capacitor ($C_R$) 40, allowing the extended valid time interval 122 to be reached more quickly, during which time the voltage ratio would provide accurate detection of diode faults. Software may be used to average the voltage ratios computed during the valid time interval 122 over a number of cycles to reduce scatter in the data.

In another embodiment (not shown), a capacitor ($C_R$) 40 can be connected across the first diode ($D_1$) 12 and a capacitor ($C_R$) 40 can be connected across the second diode ($D_2$) 14 for expediting the series diode reverse recovery time 120 regardless of whether the second diode ($D_2$) 14 or the first diode ($D_1$) 12 has a higher reverse recovery charge.

In some cases, the capacitor ($C_R$) 40 in the schematic diagram of FIG. 15 may need to be physically large to provide the required capacitance value with the appropriate voltage rating (e.g., 2000V). This size may make the use of the capacitor ($C_R$) 40 impractical for some diode fault detection modules 20 for reverse recovery charge depletion. In those cases, an active semiconductor witch can be used.

Figure 17:
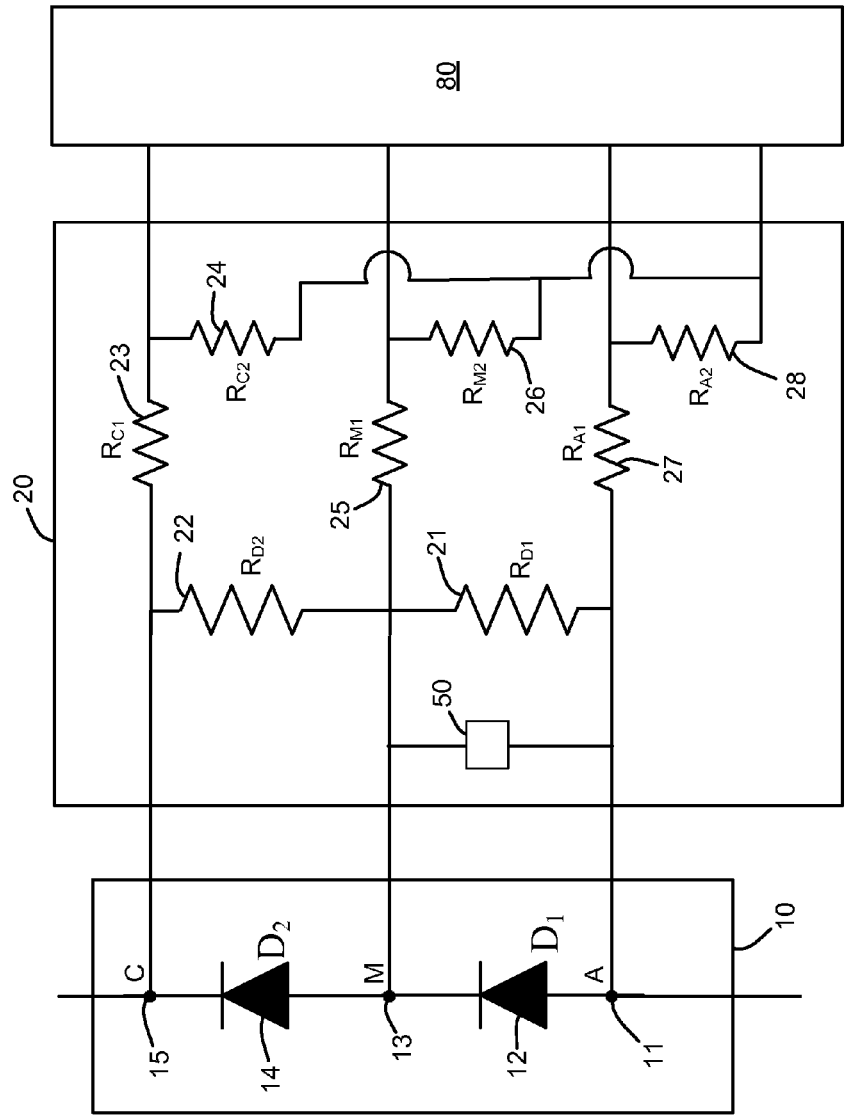
FIG. 17 is a schematic diagram of an exemplary series diode module and exemplary diode fault detection module with an active semiconductor switch for expediting the series diode reverse recovery time in an exemplary embodiment of the invention.
Figure 18:
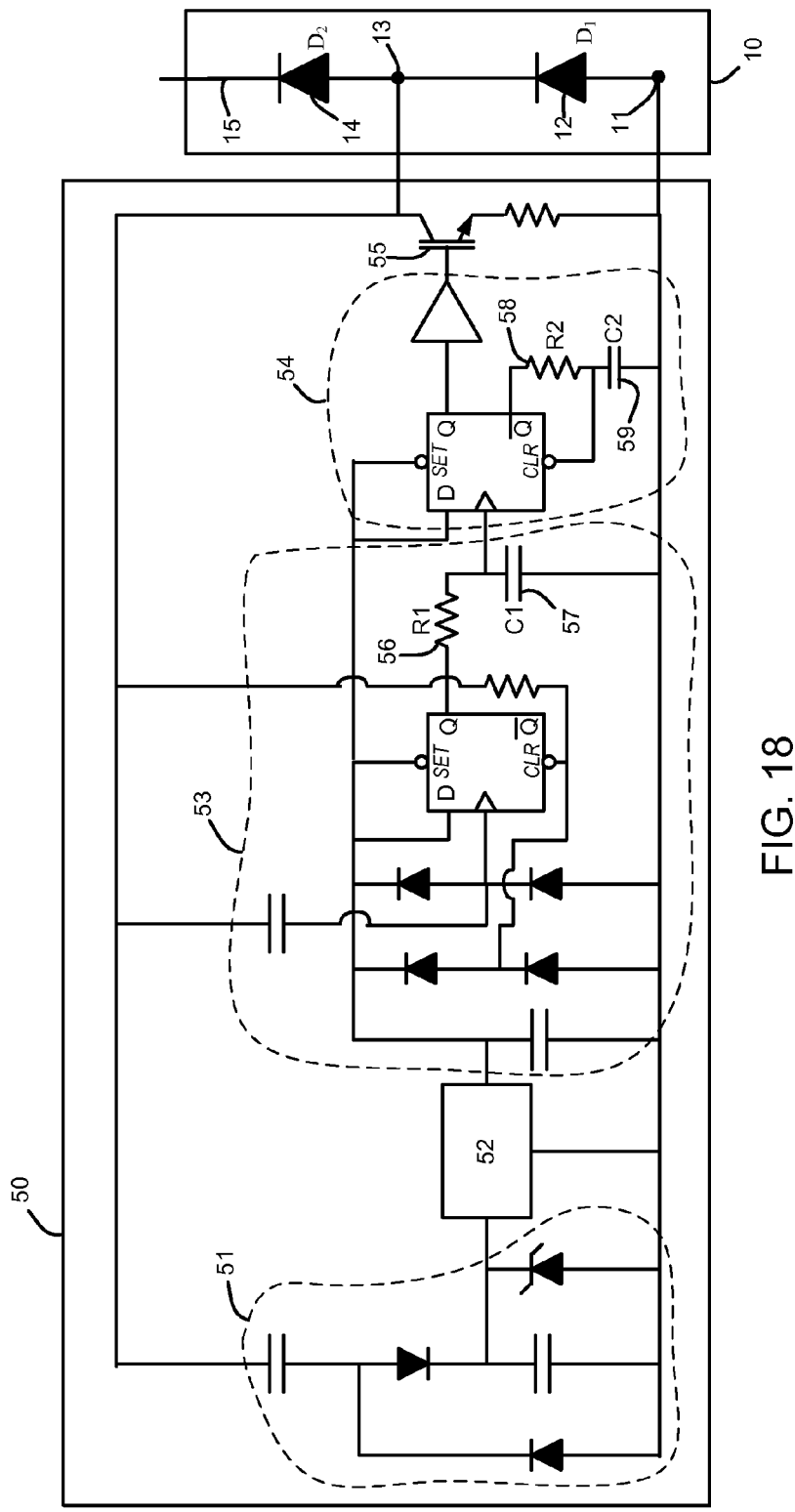
FIG. 18 is a schematic diagram of an active semiconductor switch used in the schematic diagram of FIG. 17 in an exemplary embodiment of the invention.

FIG. 17 is a schematic diagram of an exemplary series diode module 10 and exemplary diode fault detection module 20 with an active semiconductor switch 50 for expediting the series diode reverse recovery time 120 in an exemplary embodiment of the invention. The active semiconductor switch 50 may take many forms (e.g., a MOSFET, Insulated Gate Bipolar Transistor (IGBT), or bipolar device). FIG. 18 is a schematic diagram of an exemplary active semiconductor switch 50 used in the schematic diagram of FIG. 17 in an exemplary embodiment of the invention. An Insulated Gate Bipolar Transistor (IGBT) 55 is connected in parallel across the first diode ($D_1$) 12 and is positioned to allow the residual reverse recovery charge in the second diode ($D_2$) 14 to be rapidly depleted by current flowing through the second diode ($D_2$) 14 after the first diode ($D_1$) 12 has completed reverse recovery. This transistor 55 is selected to have the capacity to be turned on for typically just a few microseconds and be able to conduct relatively large currents, perhaps 20 to 50 Amperes. This allows the transistor 55 to remove large amounts of reverse recovery charge from the second diode ($D_2$) 14 that is connected in series with it. A charge pump circuit 51 generates a DC voltage of about 10V from which a 5V DC supply is created using a linear regulator 52. A flip-flop timer 53 is set at the beginning of the reverse polarity portion of the AC cycle and reset at the beginning of the forward polarity portion of the AC cycle. As this flip-flop timer 53 is set, it initiates a delay determined by the time constant $R_1C_1$ after which a second flip-flop timer with output buffer 54 generates the IGBT gate pulse whose duration is determined by the time constant $R_2C_2$. The purpose of the first delay is to establish when in the cycle the IGBT is turned on (e.g., after any ringing period) and the purpose of the second delay is to establish the turn-on duration. The criteria for determining these delays are based on achieving a rapid series diode reverse recovery time 120, and managing the worst case power dissipation in the IGBT.

Figure 19:
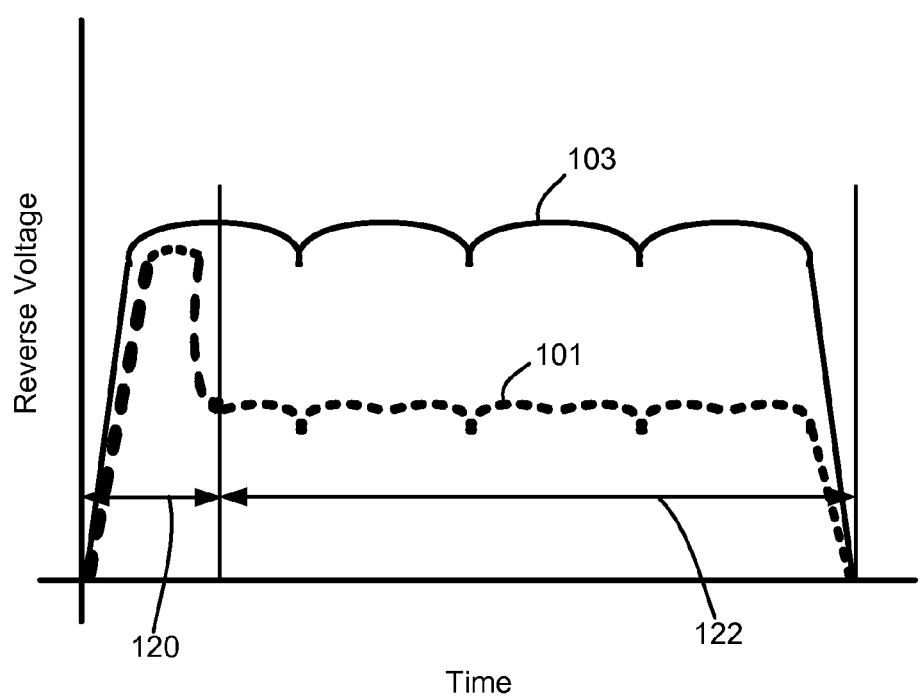
FIG. 19 is a graph of the reverse voltage across the diodes of an exemplary series diode module during the reverse polarity portion of the AC cycle in the schematic diagram of FIGS. 17 and 18 in an exemplary embodiment of the invention.

FIG. 19 is a graph of the reverse voltage across the diodes 12, 14 of an exemplary series diode module 10 during the reverse polarity portion of the AC cycle in the schematic diagram of FIGS. 17 and 18 in an exemplary embodiment of the invention. As compared with FIG. 14 for a circuit not having the active semiconductor switch 50, the series diode reverse recovery time 120 is greatly reduced by the addition of the active semiconductor switch 50 (approximately equal to the time constant provided by $R_1C_1$), allowing the extended valid time interval 122 to be reached more quickly, during which time the voltage ratio would provide accurate detection of diode faults.

In another embodiment (not shown), an active semiconductor switch 50 can be connected across the first diode ($D_1$) 12 and an active semiconductor switch 50 can be connected across the second diode ($D_2$) 14 for expediting the series diode reverse recovery time 120 regardless of whether the second diode ($D_2$) 14 or the first diode ($D_1$) 12 has a higher reverse recovery charge.

It will be understood that the invention is not limited to the exemplary ratios disclosed, but instead can be practiced with any and all ratios that can be set and changed by the software in the microprocessor 96 providing highly flexible diode fault detection.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for fault detection of a first diode and a second diode connected in series in a rectifier of an AC signal, the method comprising the steps of:
    measuring a first voltage across the first diode;
    measuring a second voltage across the first diode and the second diode;
    determining the voltage ratio between the first voltage and the second voltage; and
    determining whether the voltage ratio is within a range of values,
    wherein a fault is detected in the first diode or the second diode if the voltage ratio is outside of the range of values, and
    wherein the first voltage is the reverse voltage across the first diode during the reverse polarity cycle of the AC signal, and the second voltage is the reverse voltage across the first diode and the second diode during the reverse polarity cycle of the AC signal, wherein a short circuit is detected across the first diode or the second diode if the ratio is outside the range of values.

2. The method of claim 1, wherein the voltage ratio between the first voltage and the second voltage is the ratio of the first voltage to the second voltage.

3. The method of claim 2, wherein the range of values is 0.4 to 0.6.

4. The method of claim 1, wherein the voltage ratio between the first voltage and the second voltage is the ratio of the second voltage to the first voltage.

5. The method of claim 4, wherein the range of values is 1.6 to 2.4.

6. The method of claim 1, wherein the first diode is an anode side diode and the second diode is a cathode side diode, and wherein the cathode of the first diode is connected in series to the anode of the second diode.

7. The method of claim 1, wherein the first diode is a cathode side diode and the second diode is an anode side diode, and wherein the anode of the first diode is connected in series to the cathode of the second diode.

8. The method of claim 1, wherein the steps of measuring a first voltage across the first diode, measuring a second voltage across the first diode and the second diode, and determining the voltage ratio between the first voltage and the second voltage take place after the reverse recovery times of the first diode and second diode are completed.

9. A method for fault detection of a first diode and a second diode connected in series in a rectifier of an AC signal, the method comprising the steps of:
    measuring a first voltage across the first diode;
    measuring a second voltage across the second diode;
    determining the voltage ratio between the first voltage and the second voltage; and
    determining whether the voltage ratio is within a range of values,
    wherein a fault is detected in the first diode or the second diode if the voltage ratio is outside of the range of values, and
    wherein the first voltage is the reverse voltage across the first diode during the reverse polarity cycle of the AC signal, and the second voltage is the reverse voltage across the second diode during the reverse polarity cycle of the AC signal, wherein a short circuit is detected across the first diode or the second diode if the ratio is outside the range of values.

10. The method of claim 9, wherein the voltage ratio between the first voltage and the second voltage is the ratio of the first voltage to the second voltage.

11. The method of claim 10, wherein the range of values is 0.8 to 1.2.

12. The method of claim 9, wherein the voltage ratio between the first voltage and the second voltage is the ratio of the second voltage to the first voltage.

13. The method of claim 12, wherein the range of values is 0.8 to 1.2.

14. The method of claim 9, wherein the first diode is an anode side diode and a second diode is the cathode side diode.

15. The method of claim 9, wherein the first diode is a cathode side diode and the second diode is an anode side diode.

16. The method of claim 9, wherein the steps of measuring a first voltage across the first diode, measuring a second voltage across the second diode, and determining the voltage ratio between the first voltage and the second voltage take place after the reverse recovery times of the first diode and second diode are completed.

* * * * *

UNITED STATES PATENT AND TRADEMARK OFFICE
CERTIFICATE OF CORRECTION

| | | |
|---|---|---|
| PATENT NO. | : 9,160,164 B2 | Page 1 of 1 |
| APPLICATION NO. | : 13/039236 | |
| DATED | : October 13, 2015 | |
| INVENTOR(S) | : John Mark Reschovsky | |

It is certified that error appears in the above-identified patent and that said Letters Patent is hereby corrected as shown below:

Title page, Assignee

Please add --Andritz Hydro GmbH, Wien Austria-- as the second Assignee on the face of the patent.

Signed and Sealed this
Third Day of May, 2016

Michelle K. Lee
*Director of the United States Patent and Trademark Office*